(12) United States Patent
Furihata et al.

(10) Patent No.: US 6,911,292 B2
(45) Date of Patent: Jun. 28, 2005

(54) POSITIVE RESIST COMPOSITION AND PATTERNING PROCESS

(75) Inventors: Tomoyoshi Furihata, Gunma-ken (JP); Hideto Kato, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 1 day.

(21) Appl. No.: 10/737,788

(22) Filed: Dec. 18, 2003

(65) Prior Publication Data

US 2004/0131964 A1 Jul. 8, 2004

(30) Foreign Application Priority Data

Dec. 20, 2002 (JP) .......................................... 2002-369884

(51) Int. Cl.[7] ............................. G03F 7/023; G03F 7/30
(52) U.S. Cl. ....................... 430/190; 430/192; 430/193; 430/313; 430/324; 430/326
(58) Field of Search ................................ 430/190, 192, 430/193, 313, 324, 326

(56) References Cited

U.S. PATENT DOCUMENTS

| | | | | |
|---|---|---|---|---|
| 3,634,082 A | * | 1/1972 | Christensen | ................ 430/192 |
| 4,308,368 A | * | 12/1981 | Kubo et al. | ................... 525/504 |
| 5,338,643 A | * | 8/1994 | Kanazawa et al. | ........... 430/190 |
| 5,422,221 A | * | 6/1995 | Okazaki et al. | .............. 430/190 |
| 5,942,369 A | | 8/1999 | Ota et al. | |
| 6,218,069 B1 | * | 4/2001 | Kato et al. | ................... 430/190 |

FOREIGN PATENT DOCUMENTS

| | | |
|---|---|---|
| EP | 588492 A1 | 3/1994 |
| JP | 6-202332 A | 7/1994 |
| JP | 10-207057 A | 8/1998 |

* cited by examiner

*Primary Examiner*—John S. Chu
(74) *Attorney, Agent, or Firm*—Birch, Stewart, Kolasch & Birch, LLP

(57) ABSTRACT

A positive resist composition contains a novolak resin in which 3–27 mol % of the hydroxyl group hydrogens are substituted with 1,2-naphthoquinonediazidosulfonyl ester groups, a methyl vinyl ether-monoalkyl maleate copolymer and optionally, an alkali-soluble cellulose whose glucose ring substituent groups are substituted with organic groups at a specific rate. The composition is useful as a thick film photoresist which is subject to a plating step and offers many advantages including high sensitivity, perpendicular geometry, high resolution, and crack resistance during and after the plating step.

4 Claims, 1 Drawing Sheet

POSITIVE RESIST COMPOSITION AND PATTERNING PROCESS

This Nonprovisional application claims priority under 35 U.S.C. § 119(a) on Patent Application No(s). 2002-369884 filed in JAPAN on Dec. 20, 2002, the entire contents of which are hereby incorporated by reference.

BACKGROUND OF THE INVENTION

1. Field of the Invention

This invention relates to a positive resist composition comprising an alkali-soluble novolak resin in which some hydroxyl group hydrogens are substituted with 1,2-naphthoquinonediazidosulfonyl ester groups and a methyl vinyl ether-monoalkyl maleate copolymer, and a patterning process using the same.

2. Background Art

The recent down-sizing trend of electronic equipment promotes the development of LSIs with higher integration and application-specific ICs, for which multi-pin thin layer bonding is widely employed. In the multi-pin structure, bumps having a height of at least 10 μm are requisite as connection terminals. There is a demand to have a bump forming technique. Photoresist materials are employed when bumps are formed on LSIs by a plating process. Conventional thin film resists are used to form bumps of mushroom shape, which are incompatible with a need to increase the density of LSIs by increasing the number of pins and reducing the pin spacing. It is thus believed necessary that thick film resist be used to form bumps so that the bumps may be shaped to have perpendicular sidewalls (or straight sidewalls). The thick film photoresist for use in the plating step thus has to meet all requirements including high sensitivity, perpendicular geometry, high resolution, and crack resistance during or after the plating step.

Several resist compositions were proposed to solve these problems. JP-A 10-207057 describes a positive photoresist composition in which an acrylic resin is added mainly for the purpose of improving the resistance to plating of bump-forming resist. Also known from JP-B 46-16049 is an alkali-soluble photosensitive resin composition comprising a novolak resin, a naphthoquinonediazide group-containing compound, and polyvinyl ether. Although these resist compositions are successful in improving crack resistance, the pattern shape can be degraded because of a reduced contrast of resist. JP-A 6-202332 discloses a positive photoresist composition comprising a novolak resin and a hydrolyzate of an alkyl vinyl ether/maleic anhydride copolymer having a molecular weight of 20,000 to 80,000. This composition, however, is insufficient in crack resistance during or after the plating step, especially in gold plating application.

SUMMARY OF THE INVENTION

An object of the invention is to provide a positive resist composition which when used as a thick film photoresist in a plating step, offers the advantages of high sensitivity, perpendicular geometry and high resolution as well as crack resistance during or after the plating step; and a patterning process using the same.

It has been found that a positive resist composition comprising an alkali-soluble novolak resin in which some hydrogen atoms of hydroxyl groups are substituted with 1,2-naphthoquinonediazidosulfonyl ester groups, a methyl vinyl ether-monoalkyl maleate copolymer and optionally, an alkali-soluble cellulose is effective as a thick film photoresist in a plating step because it has the advantages of high sensitivity, perpendicular geometry, high resolution and crack resistance during or after the plating step.

In a first embodiment, the invention provides a positive resist composition comprising an alkali-soluble novolak resin comprising recurring units of the structural formula (1):

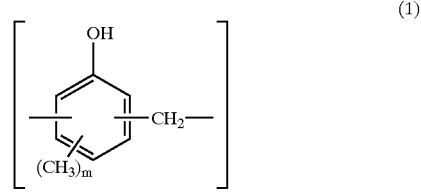

wherein m is an integer of 0 to 3, and having a weight average molecular weight of 1,000 to 30,000 based on polystyrene standards, in which 3 to 27 mol % of the hydrogen atoms of hydroxyl groups are substituted with 1,2-naphthoquinonediazidosulfonyl ester groups, and a methyl vinyl ether-monoalkyl maleate copolymer represented by the structural formula (2):

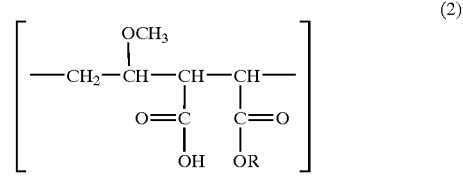

wherein R is a straight, branched or alicyclic alkyl group having 1 to 10 carbon atoms, and having a weight average molecular weight of 100,000 to 500,000 based on polystyrene standards.

In a second embodiment, the invention provides a positive resist composition comprising an alkali-soluble novolak resin comprising recurring units of the structural formula (1):

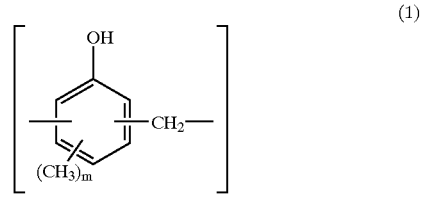

wherein m is an integer of 0 to 3, and having a weight average molecular weight of 1,000 to 30,000 based on polystyrene standards, in which 3 to 27 mol % of the hydrogen atoms of hydroxyl groups are substituted with 1,2-naphthoquinonediazidosulfonyl ester groups, a methyl vinyl ether-monoalkyl maleate copolymer represented by the structural formula (2):

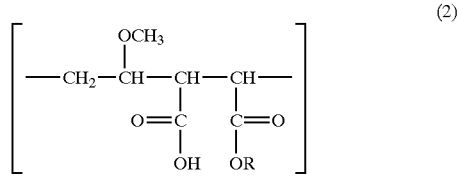

(1)

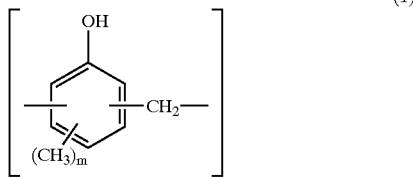

(2)

In formula (1), m is an integer of 0 to 3, preferably 1 or 2. In formula (2), R is a straight, branched or alicyclic alkyl group having 1 to 10 carbon atoms.

Examples of the straight, branched or alicyclic alkyl group having 1 to 10 carbon atoms represented by R include methyl, ethyl, propyl, isopropyl, n-butyl, isobutyl, tert-butyl, n-pentyl, tert-butylmethyl, n-hexyl, n-heptyl, n-octyl, n-decyl and cyclopropyl.

On the novolak resin, the percent substitution of 1,2-naphthoquinonediazidosulfonyl ester groups is 3 to 27 mol %, preferably 5 to 20 mol % of the hydrogen atoms of hydroxyl groups within the novolak resin. If the percent substitution of 1,2-naphthoquinonediazidosulfonyl ester groups is less than 3 mol %, then the resist composition becomes difficult to form a pattern because of a low film retention and is thus useless. If the percent substitution is more than 27 mol %, the novolak resin becomes substantially insoluble in a solvent and difficult to formulate a resist composition.

The novolak resin of structural formula (1) should have a weight average molecular weight Mw of 1,000 to 30,000, preferably 3,000 to 20,000, as determined on a basis of polystyrene standards. A Mw of less than 1,000 leads to low film retention after development and poor heat resistance whereas a Mw of more than 30,000 adversely affects the resolution and sensitivity of resists.

The methyl vinyl ether-monoalkyl maleate copolymer of structural formula (2) should have a weight average molecular weight Mw of 100,000 to 500,000, preferably 150,000 to 300,000, as determined on a basis of polystyrene standards. A Mw of less than 100,000 leads to poor crack resistance during or after a plating step whereas a Mw in excess of 500,000 adversely affects the resolution and sensitivity of resists.

In the preferred embodiment, 2 to 30 parts by weight, more preferably 5 to 20 parts by weight of the methyl vinyl ether-monoalkyl maleate copolymer of structural formula (2) is present per 100 parts by weight of the alkali-soluble novolak resin of structural formula (1). With less than 2 parts by weight of the copolymer, there is a likelihood that in the plating step after formation of a thick film resist pattern, the resist fails to withstand the stress generated upon metal growth so that the pattern may crack. With more than 30 parts by weight of the copolymer, scum may generate after development.

In the second embodiment of the invention, the positive resist composition is defined as comprising an alkali-soluble novolak resin of the structural formula (1) in which the hydrogen atoms of hydroxyl groups are partially substituted (2)

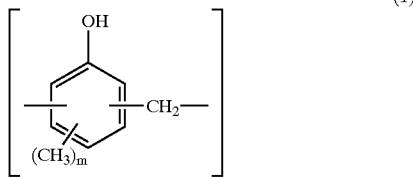

wherein R is a straight, branched or alicyclic alkyl group having 1 to 10 carbon atoms, and having a weight average molecular weight of 100,000 to 500,000 based on polystyrene standards, and an alkali-soluble cellulose represented by the structural formula (3):

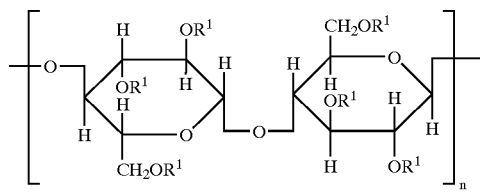

(3)

wherein $R^1$ is independently hydrogen, an alkyl group of 1 to 4 carbon atoms, a hydroxyalkyl group of 1 to 4 carbon atoms, an acyl group of 1 to 8 carbon atoms or an organic group of the structural formula (4):

(4)

wherein R' is a $C_{1-6}$ alkylene, phenylene or cyclohexylene group, in a range providing an acid value of 30 to 150, the proportion of the organic group of formula (4) in $R^1$ is on average 2 to 30 mol % per unit glucose ring, and n is an integer of 2 to 10,000.

In a third embodiment, the invention provides a patterning process comprising the steps of (i) applying the positive resist composition defined above onto a substrate, (ii) exposing the applied resist through a photomask to light having a wavelength of 150 to 450 nm, and (iii) developing the exposed resist with a liquid developer. When the above process is followed by the step (iv) of forming a metal layer on the substrate by electrolytic plating or chemical plating, a process for forming a plating pattern is obtained.

BRIEF DESCRIPTION OF THE DRAWING

The only FIGURE.

DESCRIPTION OF THE PREFERRED EMBODIMENTS

Figure 1:
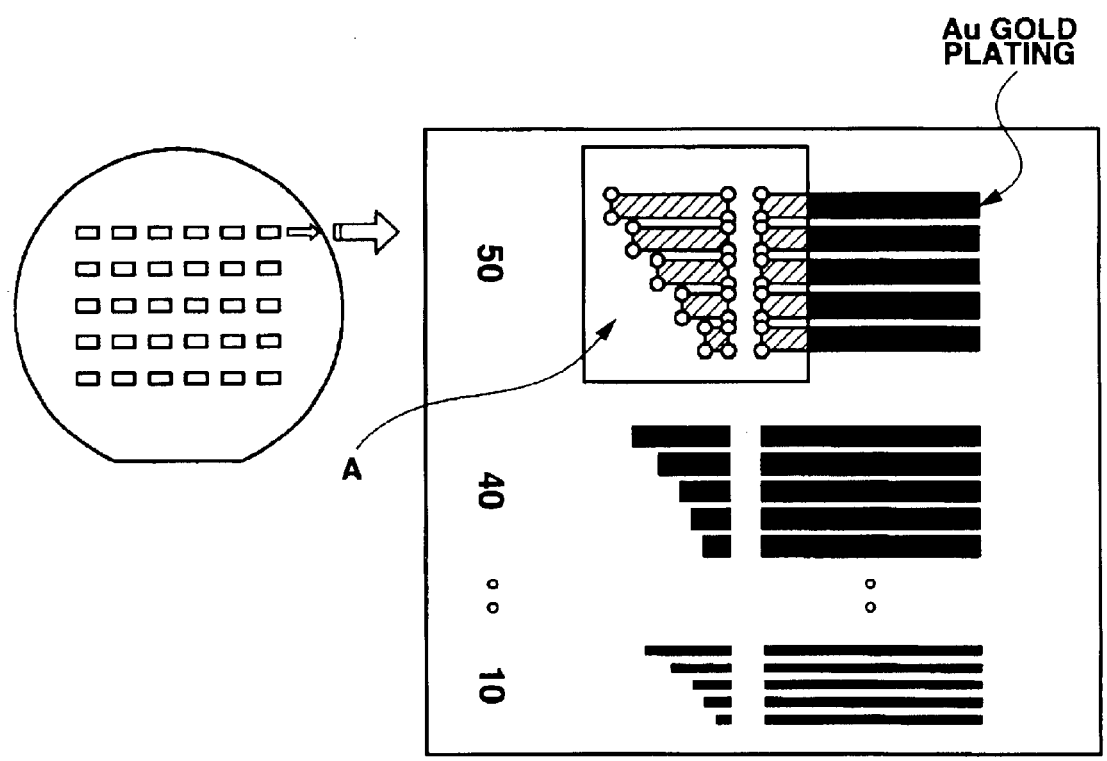
FIG. 1 is a schematic view illustrating an area on a resist pattern where cracks are checked.

In the first embodiment of the invention, the positive resist composition is defined as comprising an alkali-soluble novolak resin of the structural formula (1) in which the hydrogen atoms of hydroxyl groups are partially substituted with 1,2-naphthoquinonediazidosulfonyl ester groups and a methyl vinyl ether-monoalkyl maleate copolymer represented by the structural formula (2).

with 1,2-naphthoquinonediazidosulfonyl ester groups, a methyl vinyl ether/monoalkyl maleate copolymer of the structural formula (2), and an alkali-soluble cellulose resin having the structural formula (3). The novolak resin and the copolymer are as described above.

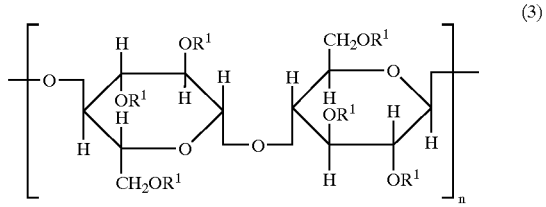

(3)

In formula (3), $R^1$ is independently hydrogen, an alkyl group of 1 to 4 carbon atoms, a hydroxyalkyl group of 1 to 4 carbon atoms, an acyl group of 1 to 8 carbon atoms or an organic group of the structural formula (4):

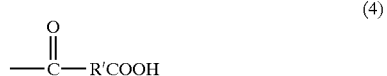

(4)

wherein R' is a $C_{1-6}$ alkylene, phenylene or cyclohexylene group, in a range providing an acid value of 30 to 150, the proportion of the organic group of formula (4) in $R^1$ is on average 2 to 30 mol % per unit glucose ring, and n is an integer of 2 to 10,000.

This alkali-soluble cellulose resin itself is hydrophobic and acid resistant because the carboxyalkyl groups introduced do not dissociate under acidic conditions, but can be dissolved in an aqueous alkaline liquid because the carboxyalkyl groups dissociate in a weakly acidic to neutral region, and thus becomes a resin binder transparent to an exposure light source. The inclusion of the alkali-soluble cellulose resin achieves a high sensitivity for the above reason, and improves film formation and crack resistance during the plating step. A cellulose resin of formula (3) having an acid value of less than 30 is less effective for sensitivity improvement. If the acid value of the cellulose resin is more than 150, the film retention after pattern formation is reduced.

As long as the cellulose resin has an acid value of 30 to 150, $R^1$ is independently selected from among hydrogen, an alkyl group of 1 to 4 carbon atoms, a hydroxyalkyl group of 1 to 4 carbon atoms and an organic group of the structural formula (4). The proportion of the organic group of formula (4) in $R^1$ is on average 2 to 30 mol % per unit glucose ring. Examples of $R^1$ include hydrogen, alkyl groups of 1 to 4 carbon atoms such as methyl, ethyl, propyl, isopropyl, n-butyl, isobutyl and tert-butyl, hydroxyalkyl groups of 1 to 4 carbon atoms such as hydroxymethyl, hydroxyethyl and 2-hydroxypropyl, and acyl groups such as acetyl, propionyl and butyryl. In formula (4), R' is an alkylene group of 1 to 6 carbon atoms, such as ethylene, a phenylene group or a cyclohexylene group.

The proportion of the organic group of formula (4) in $R^1$ is on average 2 to 30 mol %, preferably 5 to 25 mol %, per unit glucose ring. If the proportion of the organic group of formula (4) is less than 2 mol %, the resin becomes less dissolvable in an alkali solution upon development. If the proportion of the organic group of formula (4) is more than 30 mol %, the resin becomes too much dissolvable in an alkali solution, which becomes the cause of film slimming after development.

The subscript n is an integer of 2 to 10,000, preferably 100 to 5,000.

The preferred amount of the alkali-soluble cellulose resin of structural formula (3) blended is 10 to 30 parts by weight, more preferably 10 to 25 parts by weight, per 100 parts by weight of the alkali-soluble novolak resin of structural formula (1). With less than 10 parts of the cellulose resin, the resist may fail to withstand the stress of metal growth during the plating step after thick-film resist pattern formation, so that the pattern may crack. With more than 30 parts of the cellulose resin, the solubility of the composition in an aqueous alkaline solution may increase at the expense of film retention and adhesion of the composition to substrates.

On use, the positive resist composition in either the first or the second embodiment of the invention is dissolved in an organic solvent. Any organic solvent may be used as long as the components are fully soluble therein and effective application is possible. Examples include cellosolve solvents such as methyl cellosolve, ethyl cellosolve, methyl cellosolve acetate and ethyl cellosolve acetate; propylene glycol solvents such as propylene glycol monomethyl ether, propylene glycol monobutyl ether, propylene glycol monomethyl ether acetate, propylene glycol dimethyl ether and propylene glycol monoethyl ether acetate; ester solvents such as butyl acetate, amyl acetate, methyl lactate, ethyl lactate, 3-methoxypropionic acid and ethyl 3-ethoxypropionate; alcohol solvents such as hexanol and diacetone alcohol; ketone solvents such as cyclohexanone and methyl amyl ketone; ether solvents such as methyl phenyl ether and diethylene glycol dimethyl ether; and highly polar solvents such as N,N-dimethylformamide and N-methylpyrrolidone, and mixtures of any.

The amount of the organic solvent used is preferably 1 to 20 times, more preferably 1 to 15 times the total weight of solids (novolak resin+copolymer+cellulose resin).

Beside the above-mentioned components, the inventive resist composition may contain optional additives such as leveling agents, dyes, pigments, and surfactants.

A known lithographic process may be used to form a pattern from the positive resist composition of the invention. For example, the resist composition is typically spin-coated or otherwise applied to a silicon wafer or a substrate having a surface metallized by sputtering or plating, then pre-baked at about 80 to 130° C. for about 50 to 600 seconds to form a resist film having a thickness of 1 to 50 μm, preferably 5 to 30 μm, more preferably 10 to 25 μm. Next, the resist film is exposed, through a patterning mask held over it, to sub-500 nm wavelength high-energy radiation (e.g., i- or g-line) or electron beams in a dose of about 1 to 5,000 mJ/cm², and preferably about 100 to 2,000 mJ/cm². If necessary, the resist film is then post-exposure baked (PEB) on a hot plate at 60 to 150° C. for 1 to 10 minutes, and preferably at 80 to 120° C. for 1 to 5 minutes. The exposed resist is then developed by an ordinary method, such as a dip, puddle or spray process, for a period of 0.5 to 20 minutes, and preferably 1 to 10 minutes, using an aqueous alkali solution such as 0.1 to 5 wt %, and preferably 2 to 3 wt %, tetramethylammonium hydroxide (TMAH), thereby forming the desired pattern on the substrate. The development may be followed by post-baking at about 50 to 100° C. for about 10 to 600 seconds.

The substrate on which the resist pattern has been formed is subjected to ashing by oxygen plasma or the like for removing minute resist residues on the pattern and for rendering the resist surface hydrophilic. Thereafter, electrolytic plating or electroless (or chemical) plating is performed to form the desired metal pattern on the substrate. Typical metals to be plated are gold, copper, iron and nickel. The metal layer preferably has a thickness of 1 to 40 μm, more preferably 5 to 20 μm.

The positive resist composition of the invention is useful as a thick film photoresist subject to a plating step, has the advantages of high sensitivity, perpendicular geometry, high resolution and crack resistance during or after the plating step. The resist assists in forming metal terminals as typified by bumps.

EXAMPLE

Examples of the invention are given below by way of illustration and not by way of limitation.

Synthesis Example 1
Synthesis of 1,2-naphthoquinonediazidosulfonyl Ester Group-substituted Novolak Resin A three-necked flask equipped with a stirrer, condenser and thermometer was charged with 75.7 g (0.7 mol) of p-cresol, 32.5 g (0.3 mol) of m-cresol, 52.3 g (0.59 mol) of a 37 wt % formaldehyde aqueous solution, and 0.30 g ($2.40 \times 10^{-3}$ mol) of oxalic acid dihydrate as a polycondensation catalyst. The flask was immersed in an oil bath to keep the internal temperature at 100° C. while polycondensation reaction was effected for one hour. After the completion of reaction, 500 ml of methyl isobutyl ketone (MIBK) was added to the reaction solution, which was stirred for 30 minutes. With the aqueous layer separated, the product extracted in the MIBK layer was washed 5 times with 300 ml of pure water. After separation, the product was vacuum stripped at 4 mmHg and 150° C. by means of an evaporator, yielding 87 g of a novolak resin having a molecular weight Mw of 6200.

It is noted that for the measurement of Mw, a GPC column system (two G-2000H6 tubes, one G-3000H6 tube, and one G-4000H6 tube) by Toso Co., Ltd. was used while eluting solvent THF flowed at a flow rate of 1.5 ml/min and a column temperature of 40° C.

Under light shielded conditions, a three-necked flask equipped with a stirrer, dropping funnel, condenser and thermometer was charged with 120 g (1 mol) of the novolak resin obtained above and 26.8 g (0.10 mol) of 1,2-naphthoquinonediazidosulfonyl chloride, which were dissolved in 400 ml of dioxane. Then 10.1 g (0.10 mol) of triethylamine was added dropwise so that the internal temperature might not exceed 30° C. After the solution was ripened for one hour, it was poured into 5,000 ml of 0.1N aqueous hydrochloric acid. The resulting re-precipitate was filtered, dissolved again in 800 g of ethyl acetate, washed with water, and separated. The solvent was removed by vacuum stripping at 40° C. Vacuum drying yielded 140 g of a 1,2-naphthoquinonediazidosulfonyl esterified novolak resin. A PNMR analysis of the novolak resin revealed that 10 mol % of the hydrogen atoms of hydroxyl groups had been 1,2-naphthoquinonediazidosulfonyl esterified.

Synthesis Example 2
Synthesis of Methyl Vinyl Ether-monoalkyl Maleate Copolymer A three-necked flask equipped with a stirrer, dropping funnel, condenser and thermometer was charged with 100 g of a methyl vinyl ether/maleic anhydride copolymer having a Mw of about 150,000 (trade name "GANTREZ" by ISP), which was dissolved in 4,000 g of methanol. Reaction was effected under reflux at 60–65° C. for about 2 hours. After the reaction, the methanol was evaporated off, yielding 135 g of a methyl vinyl ether/monomethyl maleate copolymer having a Mw of about 200,000.

Synthesis Examples 3 and 4

As in Synthesis Example 2 using methyl vinyl ether/maleic anhydride copolymers having a Mw of about 60,000 and about 700,000, there were obtained methyl vinyl ether/monomethyl maleate copolymers having a Mw of about 80,000 (Synthesis Example 3) and about 900,000 (Synthesis Example 4), respectively.

Example 1

The 1,2-naphthoquinonediazidosulfonyl ester-substituted novolak resin obtained in Synthesis Example 1, 10 g, was dissolved in 40 g of ethyl lactate. To the solution were added 2 g of the methyl vinyl ether/monomethyl maleate copolymer with Mw about 200,000 obtained in Synthesis Example 2 and 0.05 g of surfactant X-70-093 (Shin-Etsu Chemical Co., Ltd.). The ingredients were mixed for dissolution and passed through a membrane filter with a pore diameter of 0.2 µm, obtaining a resist solution.

Using a spinner, the resist solution was applied onto a substrate in the form of a 6-inch silicon wafer having gold deposited by sputtering. The coating was prebaked on a hot plate at 120° C. for 300 seconds to form a resist film of 20 µm thick. Using a g-line stepper (NSR-TFH-1, Nikon Corporation; NA=0.22), the resist film was exposed to radiation in a desired pattern. The resist film was then subjected to puddle development for 300 seconds with a 2.38% by weight aqueous solution of tetramethylammonium hydroxide and rinsed with pure water. The resist pattern was evaluated using a SEM (S-4100, Hitachi Ltd.). The line-and-space (ranging from 10 µm to 50 µm) and hole pattern was observed to determine the perpendicularity of pattern sidewalls. The resolution was determined by the presence or absence of resist residues (scum) in spaces.

Using a dry etching apparatus (DEM-451, Nichiden Anerba Co., Ltd.), the resist pattern and the substrate surface were subjected to ashing by an oxygen plasma at 100 W for 30 seconds. The structure was then immersed in a gold plating solution (Microfab Au-100, Tanaka Kikinzoku K.K.) where gold plating was carried out at 60° C. by conducting a constant current for 100 minutes, depositing a gold layer of about 15 µm thick. After the plating, the surface was cleaned with flowing pure water. The resist surface was observed under an optical microscope and the SEM to examine whether or not the resist deformed by the stresses of plating growth, and crack resistance. For crack resistance evaluation, observation was focused at 4,500 points or corners on the resist pattern shown in FIG. 1 that were prone to crack. The number of cracked corners was counted. The pattern was judged to be fully crack resistant when the number of cracked corners was less than 100 points among 4,500 points. In FIG. 1, square A designates an area where cracks were checked. One shot ranging from 50 µm to 10 µm includes 6×5×5=150 points. Over the entire wafer surface that covers 30 shots, 150×30=4,500 points are checked.

Example 2

The 1,2-naphthoquinonediazidosulfonyl ester-substituted novolak resin obtained in Synthesis Example 1, 10 g, was dissolved in 40 g of ethyl lactate. To the solution were added 2 g of the methyl vinyl ether/monomethyl maleate copolymer with Mw about 200,000 obtained in Synthesis Example 2, 2 g of an alkali-soluble cellulose A (hydroxypropyl methyl cellulose phthalate, acid value 92, carboxybenzoyl group content 20 mol %, by Shin-Etsu Chemical Co., Ltd.), and 0.05 g of surfactant X-70-093. The ingredients were mixed for dissolution and passed through a membrane filter with a pore diameter of 0.2 µm, obtaining a resist solution. Thereafter, as in Example 1, the resist solution was coated and developed to form a resist pattern, and patterning and plating tests performed.

Comparative Example 1

The 1,2-naphthoquinonediazidosulfonyl ester-substituted novolak resin obtained in Synthesis Example 1, 10 g, was dissolved in 40 g of ethyl lactate. To the solution were added 2 g of the methyl vinyl ether/monomethyl maleate copolymer with Mw about 80,000 obtained in Synthesis Example 3 and 0.05 g of surfactant X-70-093. The ingredients were mixed for dissolution and passed through a membrane filter with a pore diameter of 0.2 μm, obtaining a resist solution. Thereafter, as in Example 1, the resist solution was coated and developed to form a resist pattern, and patterning and plating tests performed.

Comparative Example 2

The 1,2-naphthoquinonediazidosulfonyl ester-substituted novolak resin obtained in Synthesis Example 1, 10 g, was dissolved in 40 g of ethyl lactate. To the solution were added 2 g of the methyl vinyl ether/monomethyl maleate copolymer with Mw about 700,000 obtained in Synthesis Example 4 and 0.05 g of surfactant X-70-093. The ingredients were mixed for dissolution and passed through a membrane filter with a pore diameter of 0.2 μm, obtaining a resist solution. Thereafter, as in Example 1, the resist solution was coated and developed to form a resist pattern, and patterning and plating tests performed.

Comparative Example 3

The 1,2-naphthoquinonediazidosulfonyl ester-substituted novolak resin obtained in Synthesis Example 1, 10 g, was dissolved in 40 g of ethyl lactate. To the solution were added 2 g of an alkali-soluble cellulose B (hydroxypropyl methyl cellulose hexahydrophthalate, acid value 170, carboxycyclohexanoyl group content 27 mol %, by Shin-Etsu Chemical Co., Ltd.) and 0.05 g of surfactant X-70-093. The ingredients were mixed for dissolution and passed through a membrane filter with a pore diameter of 0.2 μm, obtaining a resist solution. Thereafter, as in Example 1, the resist solution was coated and developed to form a resist pattern, and patterning and plating tests performed.

The results are shown in Table 1.

TABLE 1

| | Pattern resolution | Crack resistance during plating step (cracked points) |
|---|---|---|
| Example 1 | perpendicular sidewall, no scum | resist not deformed, crack resistant (8 points) |
| Example 2 | perpendicular sidewall, no scum | resist not deformed, crack resistant (1 point) |
| Comparative Example 1 | perpendicular sidewall, no scum | resist not deformed, prone to crack (600 points) |
| Comparative Example 2 | perpendicular sidewall, scum | resist deformed, crack resistant (22 points) |
| Comparative Example 3 | positively tapered sidewall, no scum | resist not deformed, prone to crack (150 points) |

Japanese Patent Application No. 2002-369884 is incorporated herein by reference.

Although some preferred embodiments have been described, many modifications and variations may be made thereto in light of the above teachings. It is therefore to be understood that the invention may be practiced otherwise than as specifically described without departing from the scope of the appended claims.

What is claimed is:

1. A positive resist composition comprising
an alkali-soluble novolak resin comprising recurring units of the structural formula (1):

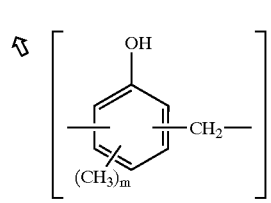

(1)

wherein m is an integer of 0 to 3, and having a weight average molecular weight of 1,000 to 30,000 based on polystyrene standards, in which 3 to 27 mol % of the hydrogen atoms of hydroxyl groups axe substituted with 1,2-naphthoquinonediazidosulfonyl ester groups, and a methyl vinyl ether-monoalkyl maleate copolymer represented by the structural formula (2):

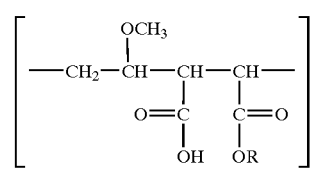

(2)

wherein R is a straight, branched or alicyclic alkyl group having 1 to 10 carbon atoms, and having a weight average molecular weight of 100,000 to 500,000 based on polystyrene standards.

2. A positive resist composition comprising
an alkali-soluble novolak resin comprising recurring units of the structural formula (1):

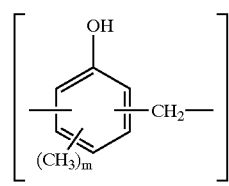

(1)

wherein m is an integer of 0 to 3, and having a weight average molecular weight of 1,000 to 30,000 based on polystyrene standards, in which 3 to 27 mol % of the hydrogen atoms of bydroxyl groups are substituted with 1,2-aphthoquinonediazidosulfonyl ester groups, a methyl vinyl ether-monoalkyl maleate copolymer represented by the structural formula (2):

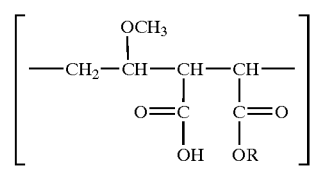

(2)

wherein R is a straight, branched or alicyclic alkyl group having 1 to 10 carbon atoms, and having a weight average molecular weight of 100,000 to 500,000 based on polystyrene standards, and an alkali-soluble cellulose represented by the structural formula (3):

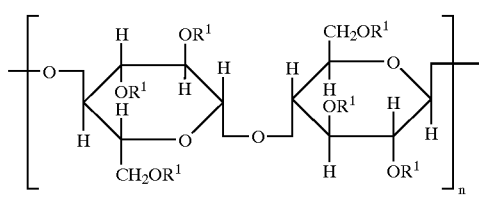
(3)

wherein $R^1$ is independently hydrogen, an alkyl group of 1 to 4 carbon atoms, a hydroxyalkyl group of 1 to 4 carbon atoms, an acyl group of 1 to 8 carbon atoms or an organic group of the structural formula (4):

(4)

wherein R' is a $C_{1-6}$ alkylene, phenylene or cyclohexylene group, in a range providing an acid value of 30 to 150, the proportion of the organic group of formula (4) in $R^1$ is on average 2 to 30 mol % per unit glucose ring, and n is an integer of 2 to 10,000.

3. A patterning process comprising the steps of:

(i) applying the positive resist composition of claim 1 or 2 onto a substrate, (ii) exposing the applied resist through a photomask to light having a wavelength of 150 to 450 nm, and (iii) developing the exposed resist with a liquid developer.

4. A process for forming a plating pattern, comprising steps (i) to (iii) of the patterning process of claim 3, and the step (iv) of forming a metal layer on the aubstrate by eleotrolytic plating or chemical plating.

* * * * *